United States Patent
Cho et al.

(10) Patent No.: US 6,839,286 B2
(45) Date of Patent: Jan. 4, 2005

(54) SEMICONDUCTOR DEVICE WITH PROGRAMMABLE IMPEDANCE CONTROL CIRCUIT

(75) Inventors: Uk-Rae Cho, Suwon-shi (KR); Tae-Hyoung Kim, Seongnam-shi (KR); Jeong-Suk Yang, Suwon-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 8 days.

(21) Appl. No.: 10/353,990

(22) Filed: Jan. 30, 2003

(65) Prior Publication Data

US 2003/0231523 A1 Dec. 18, 2003

(30) Foreign Application Priority Data

Jun. 14, 2002 (KR) ................................. 10-2002-0033129

(51) Int. Cl.[7] ................................................ G11C 11/34
(52) U.S. Cl. ............................. 365/189.05; 365/189.07
(58) Field of Search ....................... 365/189.05, 189.07; 326/30

(56) References Cited

U.S. PATENT DOCUMENTS 6,573,746 B2 * 6/2003 Kim et al. ..................... 326/30

FOREIGN PATENT DOCUMENTS

KR 2001-0050550 6/2001

* cited by examiner

Primary Examiner—M. Tran
(74) Attorney, Agent, or Firm—Harness, Dickey & Pierce, P.L.C.

(57) ABSTRACT

An output impedance control circuit of a semiconductor device. A first transistor is connected to a pad and a level controller controls a gate voltage of the first transistor in response to a voltage of the pad and a reference voltage. A MOS array is connected between the pad and a power supply voltage and supplies current to the pad in response to an impedance control code. A first control circuit generates the impedance control code in response to whether a voltage of the pad is converging to the reference voltage. A second control circuit controls a pull-up impedance of the output buffer circuit in response to the first impedance control code when a voltage of the pad is converging to the reference voltage.

24 Claims, 7 Drawing Sheets

SEMICONDUCTOR DEVICE WITH PROGRAMMABLE IMPEDANCE CONTROL CIRCUIT

This U.S. nonprovisional application claims priority upon Korean Patent Application No. 2002-33129, filed on Jun. 14, 2002, the contents of which are herein incorporated by reference in their entirety.

FIELD OF THE INVENTION

The present invention is directed to nonvolatile storage devices, and, in particular, a flash memory device with reduced program time.

BACKGROUND OF THE INVENTION

Various semiconductor devices such as microcomputers, memories, and gate arrays are provided in many electric products, for example, personal computers and workstations. In most cases, semiconductor devices include input/output pins for external data transmission and an output circuit for outputting data. For example, the output circuit has output buffers and drivers.

When semiconductor devices are provided in electric products, their input/output pins are connected to corresponding transmission lines such as wires on a board. Internal data from a semiconductor device is provided to another semiconductor device through transmission lines that form an interface. In order for output data of a semiconductor device to be properly transmitted through transmission lines, impedance between input/output lines and transmission lines should be matched.

As operation speeds of electric products increase, a swing width of a signal interface between semiconductor devices decreases. This allows a delay time to be reduced at signal transmission. However, as the swing width of a transmitted signal decreases, the semiconductor device may be affected by external noise and reflection of an output signal due to an impedance mismatch at the interface. Impedance mismatch is caused by external noise or by power supply voltage, temperature and process variations. If an impedance mismatch exists, it may be difficult to transmit data at a high speed, and data from a semiconductor device may be distorted. Thus, in a case where a semiconductor device receives distorted data, problems can be caused by a setup/hold fail or erroneous judgment of received data.

Conventional semiconductor memory devices have adopted impedance correcting techniques for matching impedance with other devices. For example, in an HSTL (high speed transceiver logic) interface, a technique is used for controlling impedance so as to have a desired output impedance value within several tens ohms using one extra pin. In such a semiconductor device, however, it is difficult to obtain an output impedance equal to a designed value due to power supply voltage, temperature, and process variations.

To overcome the aforementioned problems, generally, a trimming circuit having a metal, bonding or fuse operation is provided in a semiconductor device. Impedance matching is accomplished by adjusting a reference voltage for impedance matching and a resistance value range using the trimming circuit. This technique is called a programmable impedance control function. However, this technique may require considerable test time and/or an additional process for adjusting impedance. The above problems are limiting factors in decreasing fabrication cost.

SUMMARY OF THE INVENTION

In an exemplary embodiment, the present invention is directed to a semiconductor device with an impedance control circuit capable of obtaining a desired output impedance value irrespective of power supply voltage, temperature, and/or process variations.

In another exemplary embodiment, the present invention is directed to a semiconductor device with an impedance control circuit capable of obtaining a desired output impedance value irrespective of a power supply voltage, temperature, and process variations in order to match or substantially match impedance.

In another exemplary embodiment, the present invention is directed to a semiconductor device that includes a scaled-down impedance control circuit.

In another exemplary embodiment, the present invention is directed to a semiconductor device which includes an output buffer circuit having a pull-up section of pull-up transistors and a pull-down section of pull-down transistors; a pad connected to an external resistor; and an output impedance control circuit connected to the pad which controls an impedance of the output buffer circuit in response to an impedance of the external resistor.

In an exemplary embodiment, a first transistor is connected to the pad, and a level controller controls a gate voltage of the first transistor in response to a voltage of the pad and a reference voltage so as to establish the pad to a desired voltage. A first MOS array is connected between the pad and a power supply voltage and supplies current to the pad in response to a first impedance control code. A first control circuit generates the first impedance control code in response to whether a voltage of the pad converges to the reference voltage. A second control circuit controls a pull-up impedance of the output buffer circuit in response to the first impedance control code when a voltage of the pad converges in the reference voltage. A second transistor is connected between the power supply voltage and an internal node and is controlled by the output voltage of the level controller. A second MOS array is connected to the power supply voltage and the internal node and supplies current to the internal node in response to the first impedance control code. A third MOS array is connected to the internal node and a ground voltage and discharges current from the internal node to the ground voltage in response to a second impedance control code. A third control circuit generates the second impedance control code in response to whether a voltage of the internal node converges to the reference voltage. A fourth control circuit controls pull-down impedance of the output buffer circuit in response to the second impedance control code when a voltage of the internal node converges into the reference voltage.

In another exemplary embodiment, the first control circuit includes a first comparator for comparing a voltage of the pad with the reference voltage and generating a first comparison signal as a comparison result; and a second up/down counter for generating the first impedance control code in response to the first comparison signal. The second control circuit includes a first dithering detector for responding to the first comparison signal and detecting whether a voltage of the pad converges into the reference voltage; a first register for storing the first impedance control code when a voltage of the pad converges to the reference voltage; and a transmitter for transferring the first impedance control code in the register to the output buffer circuit.

In another exemplary embodiment, the third control circuit includes a second comparator for comparing a voltage of the internal node with the reference voltage and generating a second comparison signal as a comparison result; and a second up/down counter for generating the second impedance control code in response to the second comparison signal. The fourth control circuit includes a second dithering detector for responding to the second comparison signal and detecting whether a voltage of the internal node converges to the reference voltage; and a second register for storing the second impedance control code when a voltage of the internal node converges to the reference voltage.

In accordance with another exemplary embodiment, the output impedance control circuit further includes means for controlling a feedback loop between the level controller and a gate of the second transistor in response to an output of the first dithering detector. The feedback loop is cut off before a voltage of the pad converges to the reference voltage, and when the feedback loop is cut off the first and second transistors are turned off. The feedback loop is formed when a voltage of the pad converges to the reference voltage, and when the feedback loop is formed, the first and second transistors are turned on.

In another exemplary embodiment, the means for controlling a feedback loop includes a PMOS transistors and an NMOS transistor. The PMOS transistor is connected between the power supply voltage and an output of the level controller and is controlled by an output of the dithering detector, and the NMOS transistor is connected between the output of the level controller and a gate of the second transistor and is controlled by the output of the dithering detector.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF EXEMPLARY EMBODIMENTS

Exemplary embodiments of the present invention will be more fully described with reference to the attached drawings.

Figure 1:
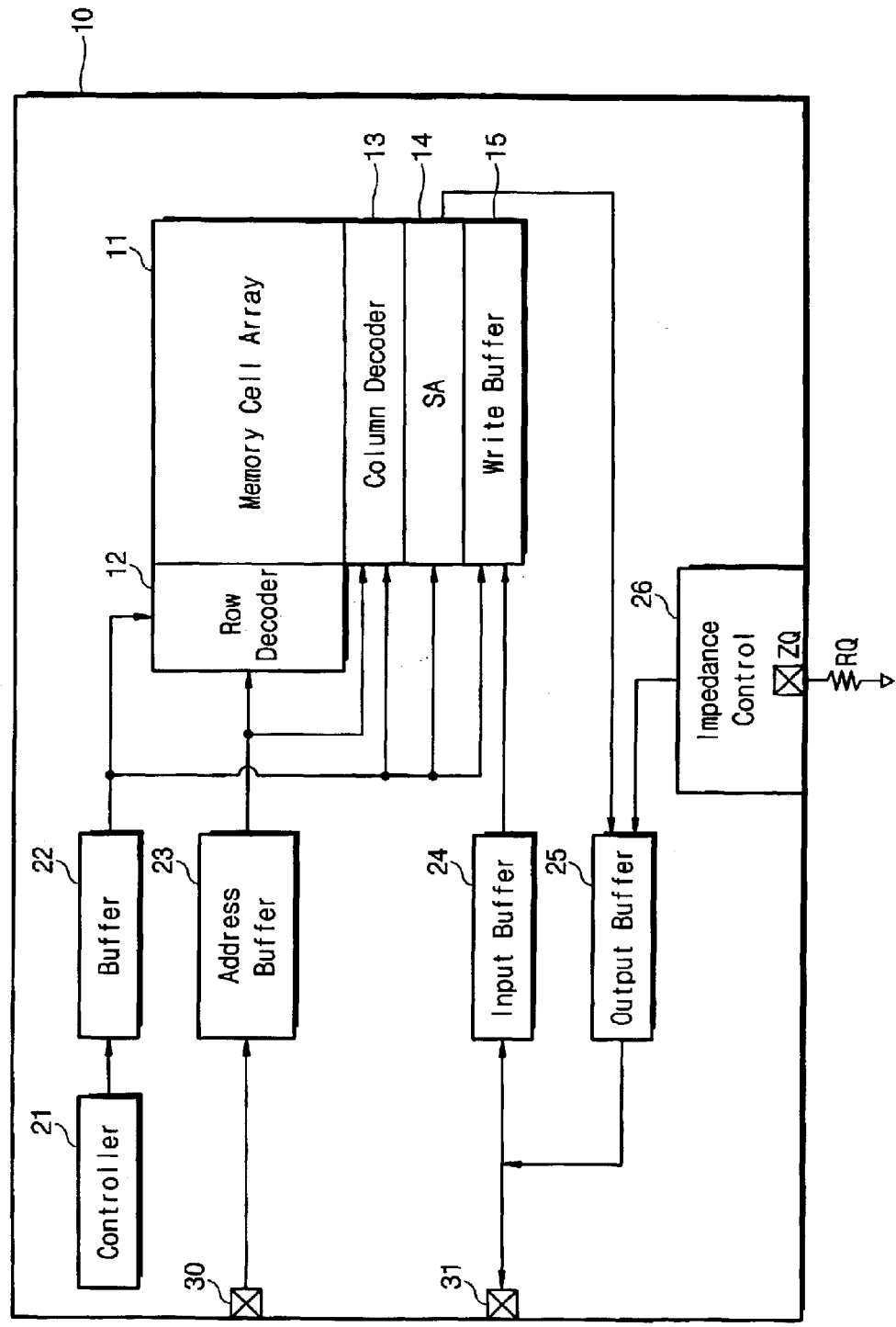
FIG. 1 is a schematic diagram of a semiconductor device according to an exemplary embodiment of the present invention.

FIG. 1 shows a semiconductor device according to an exemplary embodiment of the present invention. Referring to FIG. 1, a semiconductor device according to an exemplary embodiment of the present invention will be explained using a semiconductor memory device, but other devices may also be used. The semiconductor memory device 10 includes random access memories such as SRAM, DRAM, etc., and read only memories such as FLASH memories, ferroelectric memories, etc.

The semiconductor memory device 10 may be a memory chip and include a memory cell array 11, a row decoder circuit 12, a column decoder circuit 13, a sense amplifier circuit 14, a write buffer circuit 15, a read/write controller circuit 21, a buffer circuit 22, an address buffer circuit 23, and an input buffer circuit 24, which are known to one skilled in the art, thus description thereof will be omitted. The controller circuit 21 generates timing control signals for a read/write operation, which are provided to the circuits 12 through 15 through the buffer circuit 22.

The semiconductor memory device 10 further includes an output buffer circuit 25 connected to a pad or terminal 31 and an output impedance control circuit 26 connected to a pad or terminal ZQ. The output buffer circuit 25 outputs data read internally within the semiconductor memory device 10 externally through the pad or terminal 31, and the output impedance control circuit 26 detects an impedance of an external resistor RQ connected to the pad ZQ and controls impedance of the output buffer circuit 25. The output impedance control circuit 26 may internally generate pull-up and pull-down control codes, usable to control impedance of the output buffer circuit 25.

The external resistor RQ indicates an impedance value of a transmission line that is connected to the semiconductor memory device 10. The driving capacity of the output buffer circuit 25 can be adjusted by making an impedance of the output buffer circuit 25 equal or substantially equal to the impedance defined by the external resistor RQ. The output impedance control circuit 26 may be a programmable impedance structure to obtain the desired impedance control function.

Figure 2:
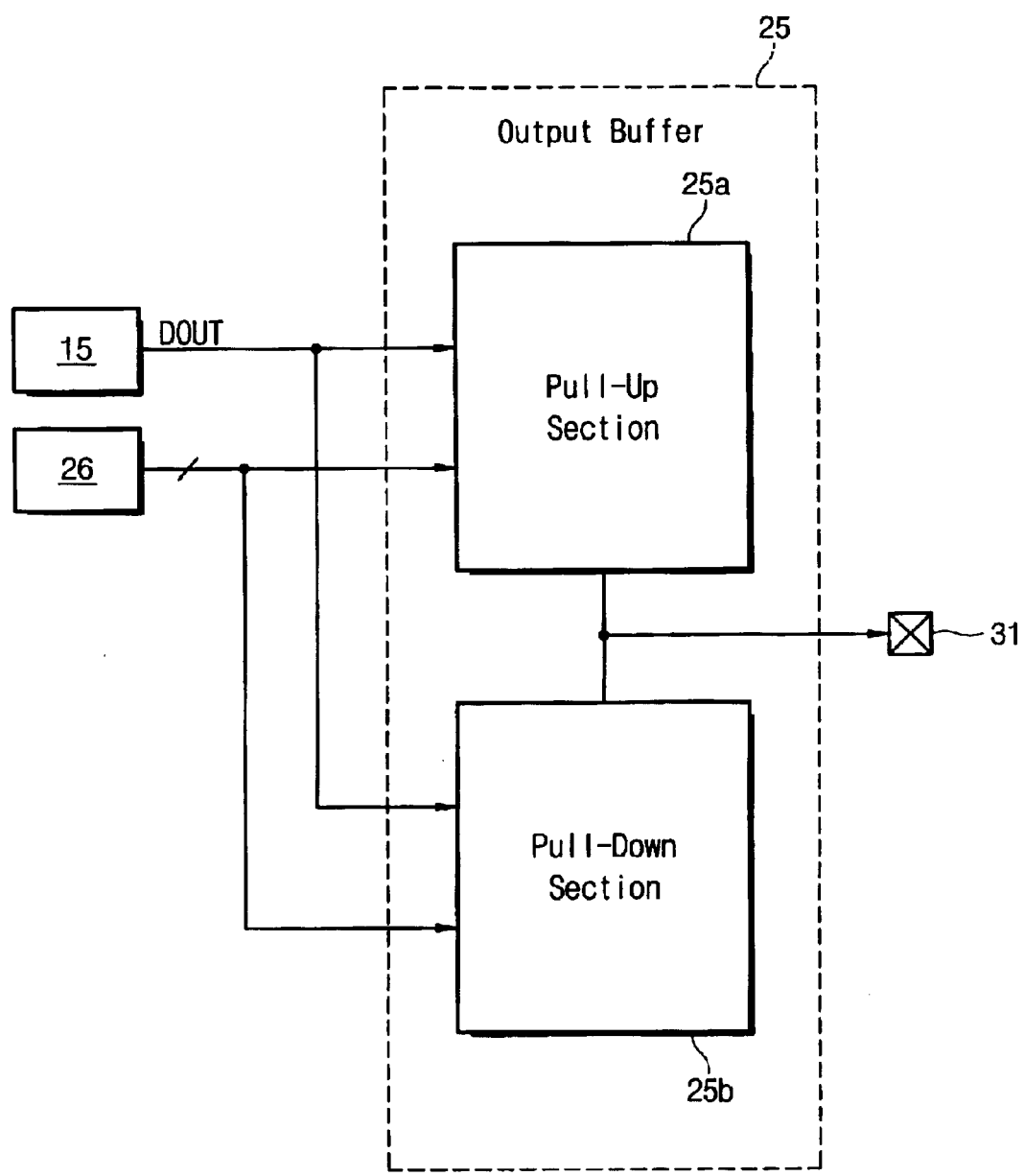
FIG. 2 is a schematic diagram of an exemplary embodiment of an output buffer circuit illustrated in FIG. 1.

FIG. 2 is a schematic diagram of an exemplary output buffer circuit of FIG. 1. Referring to FIG. 2, the output buffer circuit 25 is connected to the pad 31 and includes a pull-up section 25a and a pull-down section 25b. The pull-up section 25a may be formed of a plurality of PMOS transistors connected in parallel with the pad 31, and the pull-down section 25b may be formed of a plurality of NMOS transistors connected in parallel with the pad 31. The pull-up and pull-down sections 25a and 25b selectively drive the pad 31 in response to data DOUT to be outputted. The driving capacity or impedance of each section 25a, 25b may be determined by pull-up and pull-down control codes generated by the output impedance control circuit 26.

Figure 3:
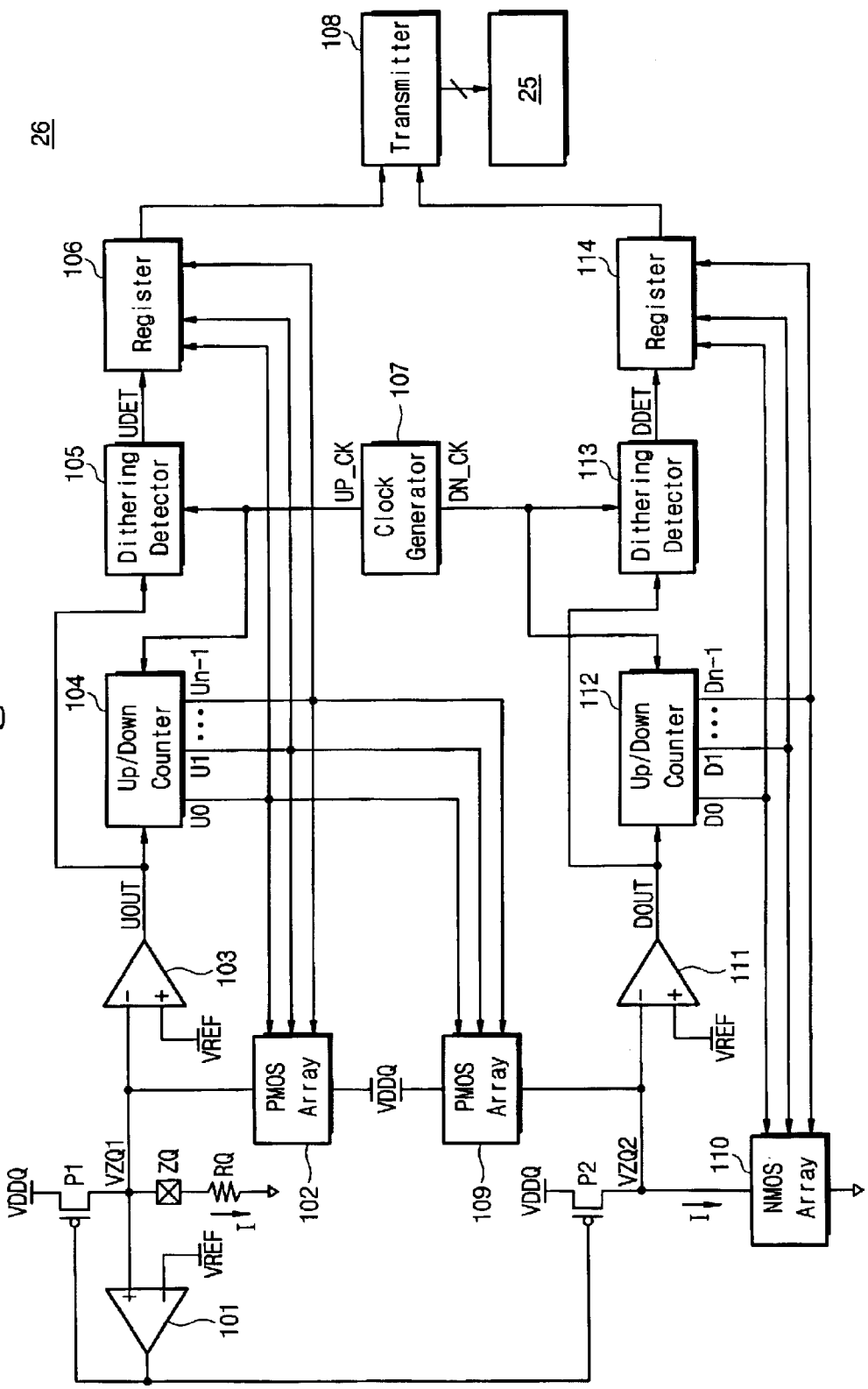
FIG. 3 is an exemplary embodiment of an output impedance control circuit illustrated in FIG. 1.

FIG. 3 is a circuit diagram of an exemplary output impedance control circuit illustrated in FIG. 1, and FIGS. 4 to 6 are exemplary circuit diagrams of MOS arrays 102, 109 and 110 of FIG. 3 according to an exemplary embodiment of the present invention.

Referring to FIG. 3, an external resistor RQ is connected to a pad or terminal ZQ. A PMOS transistor P1 is connected between a power supply voltage VDDQ and the ZQ pad, and is controlled by an output of an operational amplifier 101. The operational amplifier 101 has its inverting input terminal connected to receive a reference voltage VREF and its non-inverting input terminal connected to the ZQ pad.

In an exemplary embodiment, the reference voltage VREF is obtained by dividing the power supply voltage VDDQ, that is, through a well-known resistor divider. In an exemplary embodiment, the power supply voltage VDDQ is an operating voltage of an output buffer circuit 25 of FIG. 1, and the reference voltage VREF is half a power supply voltage VDDQ/2.

The output impedance control circuit 26 according to an exemplary embodiment of the present invention further comprises a comparator 103, an up/down counter 104, a dithering detector 105, and a register 106. The comparator 103 has its inverting input terminal connected to the ZQ pad and its non-inverting input terminal connected to receive the reference voltage VREF. The comparator 103 compares a voltage VZQ1 of the ZQ pad with the reference voltage VREF, and outputs a comparison signal UOUT of a low ('L') or high ('H') level.

The up/down counter 104 operates in synchronization with a clock signal UP_CK from a clock generator 107, and generates a pull-up control code U0-U(n−1) in response to the comparison signal UOUT from the comparator 103.

The dithering detector 105 operates in synchronization with the clock signal UP_CK, and detects whether the comparison signal UOUT has a repeat pattern (e.g. 'H', 'L', 'H', 'L', 'H'), that is, whether the voltage VZQ1 swings within a given voltage amplitude. If the comparison signal UOUT has the repeat pattern, the dithering detector 105 activates a detection signal UDET. The register 106 receives and stores the pull-up control code U0-Un−1 in response to activation of the detection signal UDET. The control code in the register 106 is transmitted to an output buffer circuit 25 through a transmitter 108, so that impedance of a pull-up section 25a in the buffer circuit 25 is adjusted.

Figure 6:
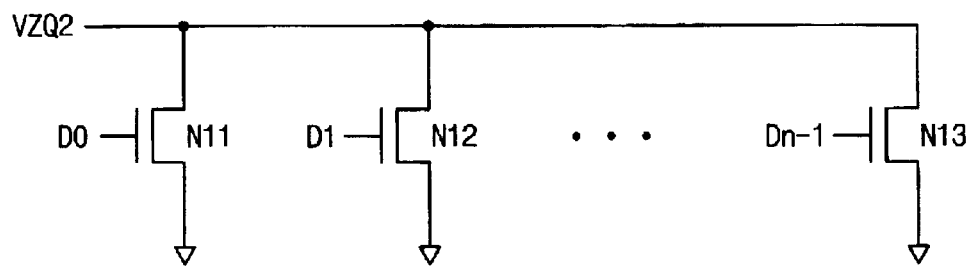

As illustrated in FIG. 3, a PMOS transistor P2 is connected between the power supply voltage VDDQ and a node voltage VZQ2, and is controlled by an output voltage of the operational amplifier 101. An NMOS array 110 is connected between the node voltage VZQ2 and a ground voltage. The NMOS array 110 may be formed of a plurality of NMOS transistors. For example, as illustrated in FIG. 6, the NMOS array 110 incorporates a plurality of NMOS transistors N11–N13 connected in parallel between the node voltage VZQ2 and the ground voltage and are turned on/off by corresponding control signals D0-D(n−1) from an up/down counter 112.

Returning to FIG. 3, a comparator 111 has its inverting input terminal connected to receive the node voltage VZQ2 and its non-inverting input terminal connected to receive the reference voltage VREF. The comparator 111 compares the node voltage VZQ2 with the reference voltage VREF, and outputs a comparison signal DOUT of a low ('L') or high ('H') level. An up/down counter 112 operates in synchronization with a clock signal DN_CK from the clock generator 107, and generates a pull-down control code D0-D(n−1) in response to the comparison signal DOUT from the comparator 111. A dithering detector 113 operates in synchronization with the clock signal UP_CK, and detects whether the comparison signal DOUT has a repeat pattern (e.g. 'H', 'L', 'H', 'L', 'H'), that is, whether the node voltage VZQ2 swings within a given voltage amplitude. If the comparison signal DOUT has the repeat pattern, the dithering detector 113 activates a detection signal DDET. A register 114 receives and stores the pull-down control code D0-D(n−1) in response to activation of the detection signal DDET. The control code in the register 114 is transmitted to the output buffer circuit 25 through the transmitter 108, so that impedance of a pull-down section 25b in the buffer circuit 25 is adjusted.

Figure 4:
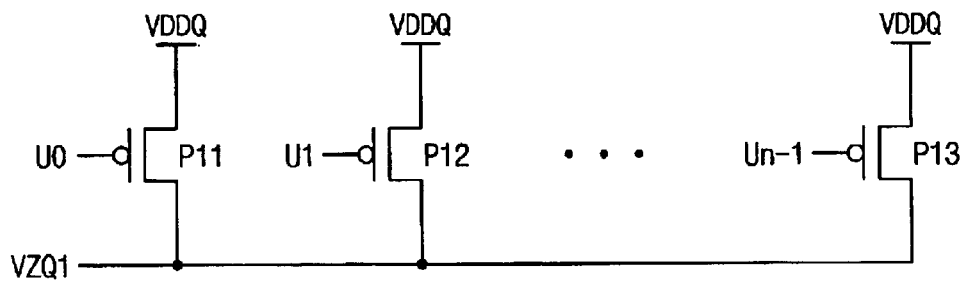
FIGS. 4 to 6 are exemplary embodiments of MOS arrays 102, 109 and 110 illustrated in FIG. 3.
Figure 5:
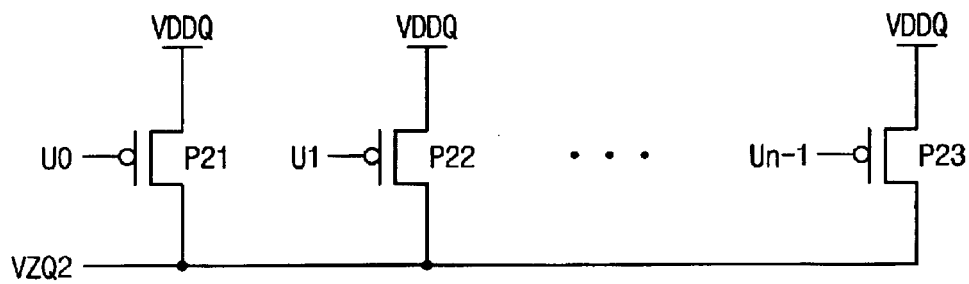

The output impedance control circuit 26 according to an exemplary embodiment of the present invention may further incorporate PMOS arrays 102 and 109. The PMOS array 102 may be connected between the power supply voltage VDDQ and the ZQ pad, and may be controlled by the pull-up control code U0-U(n−1) from the up/down counter 104. The PMOS array 109 may be connected between the power supply voltage VDDQ and the node voltage VZQ2, and may be controlled by the pull-up control code U0-U(n−1) from the up/down counter 104. As illustrated in FIG. 4, the PMOS array 102 may be formed of a plurality of PMOS transistors P11-P13 connected in parallel between the power supply voltage VDDQ and the voltage VZQ1 and are controllable by corresponding control signals U0-U(n−1) from the up/down counter 104. An exemplary PMOS array 109, as illustrated in FIG. 5, is formed of a plurality of PMOS transistors P21–P23 connected in parallel between the power supply voltage VDDQ and the voltage VZQ2 and controlled by corresponding control signals U0-U(n−1) from the up/down counter 104. In the PMOS arrays 102 and 109, a size of each transistor is sufficiently larger than that of the respective PMOS transistors P1 and P2. This will be more fully described hereinafter.

As illustrated in FIG. 3, two current sources are used to supply current to each of the VZQ1 and VZQ2 nodes. One current source is implemented using a PMOS transistor P1/P2 that is controlled by an output voltage of an operational amplifier 101. The other current source is implemented using a PMOS array 102/109 that is controlled by control signals U0-U(n−1) from the up/down counter 104. In such a configuration, a layout area of current sources according to exemplary embodiments of the present invention may be smaller than a conventional current source structure using one PMOS transistor. Also, because current from a PMOS array is adjustable using a digital control code, it is capable of flexibly controlling impedance of an output buffer circuit so as to be matched or substantially matched with the external resistor RQ.

An operation of an output impedance control circuit according to an exemplary embodiment of the present invention will be more fully described below.

An operational amplifier 101 compares a voltage VZQ1 with a reference voltage VREF (=VDDQ/2). The voltage VZQ1 is a voltage divided by the resistor RQ and a PMOS array 102. For example, when the voltage VZQ1 is lower than the reference voltage VREF, an output voltage of the operational amplifier 101 is lowered, so that the amount of current via a PMOS transistor P1 increases. That is, the voltage VZQ1 becomes higher. On the other hand, when the voltage VZQ1 is higher than the reference voltage VREF, an output voltage of the operational amplifier 101 rises, so that the voltage VZQ1 is lowered. A gate voltage of the PMOS transistor P1 is controlled such that the voltage VZQ1 has a voltage VDDQ/2. Current I flowing through the PMOS transistor P1 and the PMOS array 102 is VDDQ/2$R_Q$ (where $R_Q$ is a resistance value of the resistor RQ). The current I is supplied to an NMOS array 110 through a PMOS transistor P2 that is controlled by an output voltage of the operational amplifier 101.

Comparator 103 compares a voltage VZQ1 of the ZQ pad with the reference voltage VREF to output a comparison signal UOUT. For example, when the voltage VZQ1 is lower than the reference voltage VREF, the comparison signal UOUT has a high level (for example, a logical '1'), and when the voltage VZQ1 is higher than the reference voltage VREF, the comparison signal UOUT has a low level (for example, a logical '0'). An up/down counter 104 increments by one in response to a high-level signal UOUT and decrements by one in response to a low-level signal UOUT.

PMOS transistors P11–P13 of the PMOS array 102 are controllable by a control code U0-U(n−1) of the up/down counter 104. If a value of the control code U0-U(n-1) increases, impedance of the PMOS array 102 decreases, that is, the amount of current from the PMOS array 102 increases. If a value of the control code U0-U(n-1) decreases, impedance of the PMOS array 102 increases, that is, the amount of current from the array 102 decreases. Through the aforementioned operations, a voltage VZQ1 of the ZQ pad can be made to converge to VDDQ/2 (or VREF). Likewise, the node voltage VZQ2 can be made to converge to VDDQ/2 (or VREF) through a PMOS array 109, a comparator 111 and an up/down counter 112.

Since the PMOS array 102 is controlled by the digital control code U0-U(n-1), its resistance value may be varied in discrete increments, and it may be difficult to make the voltage VZQ1 equal to the reference voltage VREF (=VDDQ/2). Accordingly, a dithering phenomenon may exist where the voltage VZQ1 is varied within a quantization error range on the basis of the voltage VDDQ/2.

The dithering phenomenon may be detected by a dithering detector 105. For example, the dithering detector 105 detects whether the comparison signal UOUT has a pattern (for example, 'H', 'L', 'H', 'L', 'H'). If the comparison signal UOUT has such a pattern, the dithering detector 105 activates a detection signal UDET. When the detection signal UDET is activated, the voltage VZQ1 is at its closest to the reference voltage VREF, that is, VDDQ/2. When the detection signal UDET is activated, the register 106 receives and stores the pull-up control code U0-U(n-1). The control code in the register 106 is transmitted to an output buffer circuit 25 via a transmitter 108. Thus, impedance of a pull-up section 25a in the buffer circuit 25 is adjusted by the pull-up control code.

Likewise, a comparator 111, an up/down counter 112, a dithering detector 113, and a register 114 may operate the same as the elements 103, 104, 105, and 106.

Figure 7:
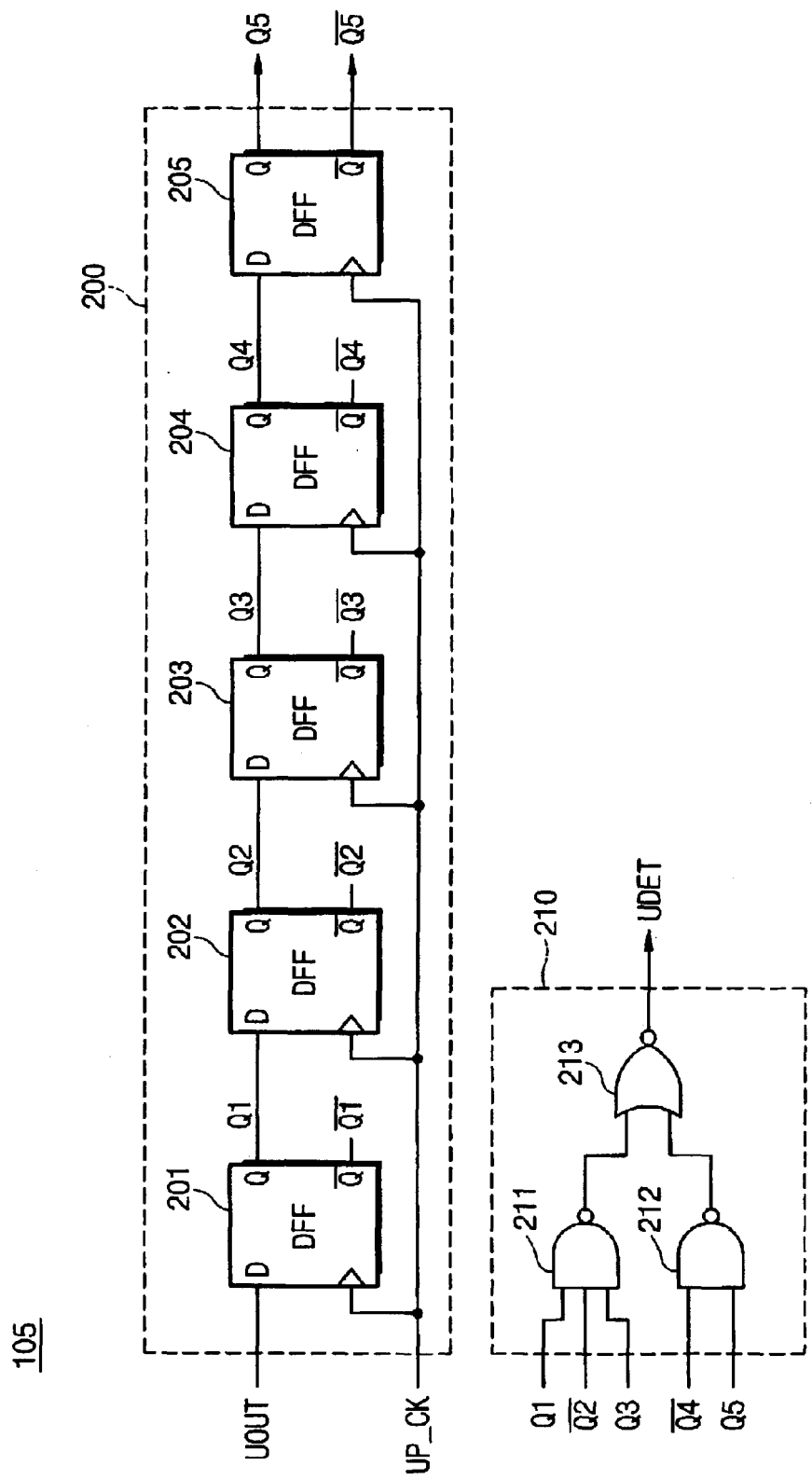
FIG. 7 is a circuit diagram of a dithering detector according to an exemplary embodiment of the present invention.
Figure 8:
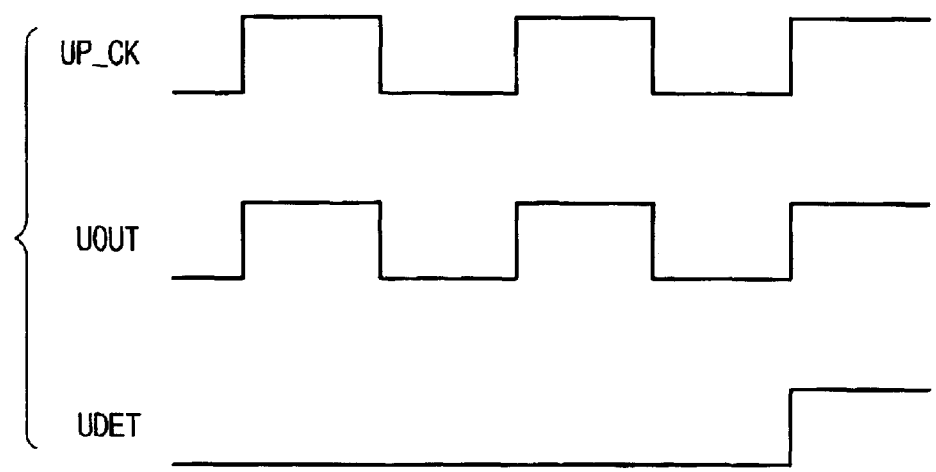
FIG. 8 is a timing diagram of exemplary input and output signals used in FIG. 7.

FIG. 7 is a circuit diagram of a dithering detector according to an exemplary embodiment of the present invention, and FIG. 8 is a timing diagram of input and output signals used in FIG. 7. The dithering detector 105 is illustrated in FIG. 7, but dithering detector 113 may also be constructed in a similar manner.

Referring to FIG. 7, the dithering detector 105-includes a flip-flop array 200 and a detection signal generator 210. The flip-flop array 200 is formed of serially-connected D flip-flops 201–205 that operate in synchronization with a clock signal UP_CK from a clock generator 107. The D flip-flop 201 receives a comparison signal UOUT from a comparator 103 in synchronization with the clock signal UP_CK. Remaining D flip-flops 202–205 receive outputs of previous stages in synchronization with the clock signal UP_CK. The detection signal generator 210 is formed of two NAND gates 211 and 212 and a NOR gate 213. The NAND gate 211 is supplied with output signals Q1, /Q2 and Q3 of the array 200, and the NAND gate 212 is supplied with output signals/Q4 and Q5 of the array 200. The NOR gate 213 receives output signals of the NAND gates 211 and 212 to output a detection signal UDET.

As illustrated in FIG. 8, if the comparison signal UOUT has a low-to-high transition and a high-to-low transition alternately, for example, when the comparison signal UOUT has a pattern of '1', '0', '1', '0', and '1', input signals Q1, /Q2, Q3, /Q4 and Q5 all have a high level. Thus the detection signal UDET transitions from a low level to a high level. This allows a register to receive and store an output of an up/down counter.

FIGS. 9(a) and (b) shows a voltage variation of a ZQ pad according to a size of a PMOS transistor P1 and a unit transistor in a PMOS array 102. As set forth above, a current driving capacity of a PMOS transistor P1 should be sufficiently larger than that of respective PMOS transistors in a PMOS array 102 for the following reason.

If a voltage VZQ1 of the ZQ pad reaches a reference voltage VREF (=VDDQ/2), an output signal UOUT of a comparator 103 has a low level (for example, a logical '0') and a high level (for example, a logical '1') alternately. This means that current supplied from the PMOS array 102 fluctuates, that is, a dithering phenomenon occurs.

Figure 9:
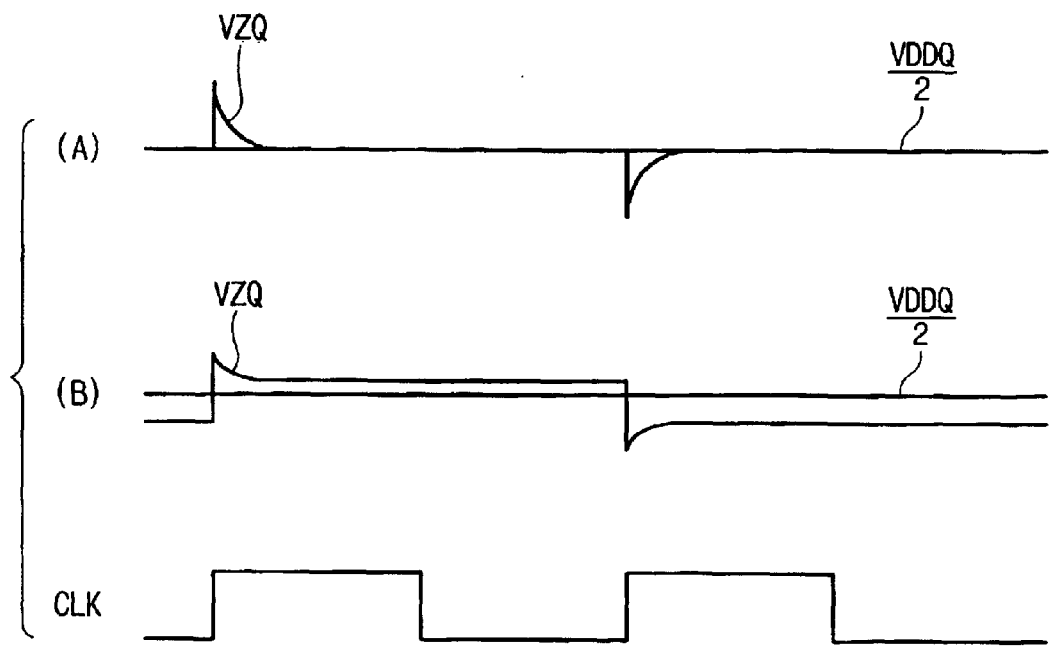
FIGS. 9(a) and (b) are diagrams showing voltage variation of a ZQ pad according to size variation of a PMOS transistor P1 and a unit transistor in a PMOS array 102.

If a size or driving capacity of the PMOS transistor P1 is smaller than that of a unit transistor in the PMOS array 102, a dithering range of the voltage VZQ1 can be reduced. However, the dithering phenomenon of the voltage VZQ1 still occurs, that is, the voltage VZQ1 does not converge to the reference voltage VREF (=VDDQ/2), as illustrated in FIG. 9.

If a size or driving capacity of the PMOS transistor P1 is larger than that of the unit transistor in the PMOS array 102, the PMOS transistor P1 can remove the dithering of the voltage VZQ1 due to a variation of current from the unit transistor in the PMOS array 102. A clock signal CLK is a clock signal UP_CK supplied to an up/down counter 104, and is obtained by sufficiently dividing a system clock so as to search an impedance control code after a peak of the voltage VZQ1 is determined. Similarly, a current driving capacity of a PMOS transistor P2 should be designed so as to become sufficiently larger than that of respective PMOS transistors in a PMOS array 109.

Figure 10:
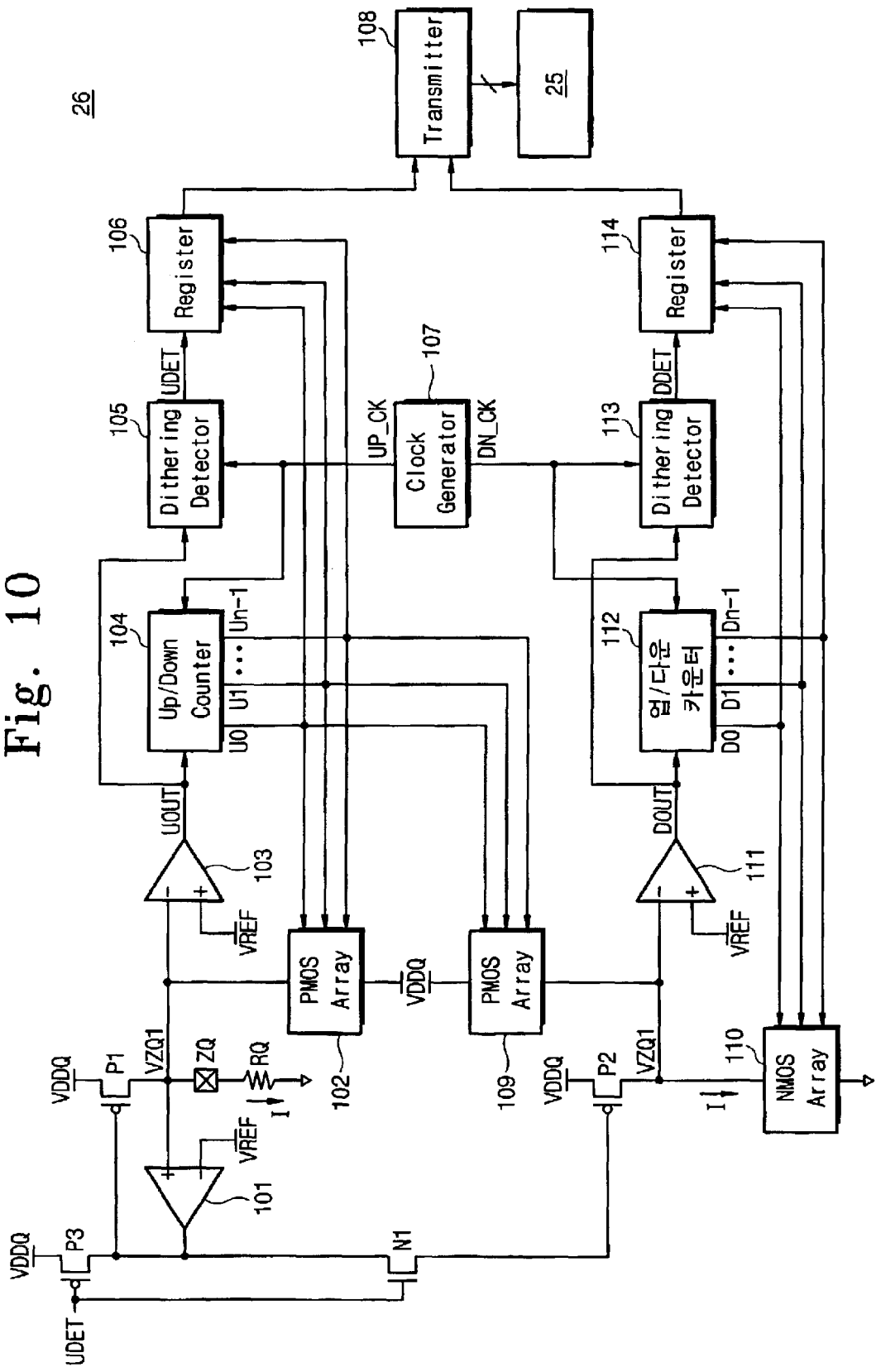
FIG. 10 is another exemplary embodiment of an output impedance control circuit illustrated in FIG. 1.

FIG. 10 shows an output impedance control circuit according to another exemplary embodiment of the present invention. In FIG. 10, constituent elements which are identical or similar with or to those in FIG. 3 are identified by the same or similar reference numerals or symbols. The output impedance control circuit in FIG. 10 is similar to that of FIG. 3, except that a PMOS transistor P3 and an NMOS transistor N1 are further incorporated in the control circuit 26. The PMOS transistor P3 is connected between a power supply voltage VDDQ and an output of an operational amplifier 101, and is controlled by a detection signal UDET from a dithering detector 105. The NMOS transistor N1 is connected between the output of the operational amplifier 101 and a gate of a PMOS transistor P2, and is controlled by the detection signal UDET.

When the detection signal UDET has a low level, the PMOS transistor P3 is turned on and a PMOS transistor P1 is turned off. The low level of the detection signal UDET means that impedance of a PMOS array 102 does not approximate the impedance of an external resistor RQ. That is, during a low level of the detection signal UDET, a voltage VZQ1 does not converge to a reference voltage VREF. Meanwhile, the NMOS transistor N1 is turned off by the detection signal UDET, so that a feedback loop between the operational amplifier 101 and the PMOS transistor P2 is cut off.

When the detection signal UDET has a high level, the PMOS transistor P3 is turned off and the NMOS transistor N1 is turned on. The high level of the detection signal UDET means that impedance of the PMOS array 102 approximates the impedance of the external resistor RQ. That is, during a high level of the detection signal UDET, a voltage VZQ1 converges to the reference voltage VREF. As the NMOS transistor N1 is turned on, a feedback loop is formed between the operational amplifier 101 and the PMOS transistor P2. Accordingly, the PMOS transistors P1 and P2 are controlled by an output voltage of the operational amplifier 101.

In the exemplary embodiment of FIG. 10, a feedback loop of an output voltage of the operational amplifier 101 is cut off until impedance of the PMOS arrays 102 and 109 is adjusted such that VZQ1 and VZQ2 voltages are established to VDDQ/2. After the VZQ1 and VZQ2 voltages are established to VDDQ/2, an output voltage of the operational amplifier 101 is fed back to the PMOS transistors P1 and P2, so that the VZQ1 and VZQ2 voltages may be more finely adjusted. That is, after impedance of MOS arrays 102, 109 and 110 becomes equal or substantially equal to that of the external resistor RQ, a feedback loop is formed between the PMOS transistors P1 and P2 and the operational amplifier 101, so that a delay time as a result of a feedback loop can be shortened.

As set forth above, an output impedance control unit may automatically match an impedance of an output buffer circuit with an external resistor RQ. Further, a circuit structure of the control circuit is simple since it has a simple current mirror structure using two PMOS transistors P1 and P2, and a quantization error can be reduced or minimized by feeding back an output of an operational amplifier 101 to PMOS transistors P1 and P2. The time required for impedance matching can be shortened by matching an impedance of MOS arrays 102, 109 and 110 with the external resistor RQ and then reducing or minimizing the quantization error of VZQ1 and VZQ2 voltages using an operational amplifier 101. In exemplary embodiments of the present invention, comparators can be implemented using an operational amplifier.

The invention has been described using exemplary embodiments. However, it is to be understood that the scope of the invention is not limited to the disclosed exemplary embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device comprising:
    an output buffer circuit including a pull-up section of pull-up transistors and a pull-down section of pull-down transistors;
    a pad connected to an external resistor; and
    an output impedance control circuit connected to the pad and which controls an impedance of the output buffer circuit in response to an impedance of the external resistor, the output impedance control circuit including a first transistor connected to the pad,
        a level controller which controls a gate voltage of the first transistor in response to a voltage of the pad and a reference voltage so as to establish the pad at a given voltage,
        a first MOS array connected between the pad and a power supply voltage which supplies current to the pad in response to a first impedance control code,
        a first control circuit which generates the first impedance control code in response to whether a voltage of the pad is converging to the reference voltage, and
        a second control circuit which controls a pull-up impedance of the output buffer circuit in response to the first impedance control code when a voltage of the pad is converging to the reference voltage.

2. The semiconductor device according to claim 1, wherein the reference voltage is half a power supply voltage that is used as an operating voltage of the output buffer circuit.

3. The semiconductor device according to claim 2, wherein the first control circuit includes:
    a first comparator which compares a voltage of the pad with the reference voltage and generates a first comparison signal as a comparison result; and
    a first up/down counter which generates the first impedance control code in response to the first comparison signal.

4. The semiconductor device according to claim 3, wherein the second control circuit includes:
    a first dithering detector which responds to the first comparison signal and detects whether a voltage of the pad is converging to the reference voltage;
    a first register which receives and stores the first impedance control code when a voltage of the pad is converging to the reference voltage; and
    a transmitter which transfers the first impedance control code in the register to the output buffer circuit.

5. The semiconductor device according to claim 4, wherein the output impedance control circuit further includes:
    a second transistor connected between the power supply voltage and an internal node which is controlled by the output voltage of the level controller;
    a second MOS array connected to the power supply voltage and an internal node which supplies current to the internal node in response to the first impedance control code;
    a third MOS array connected to the internal node and a ground voltage which discharges current from the internal node to the ground voltage in response to a second impedance control code;
    a third control circuit which generates the second impedance control code in response to whether a voltage of the internal node is converging to the reference voltage; and
    a fourth control circuit which controls a pull-down impedance of the output buffer circuit in response to the second impedance control code when a voltage of the internal node is converging to the reference voltage, the second impedance control code being transmitted to the output buffer circuit via the transmitter.

6. The semiconductor device according to claim 5, wherein the third control circuit includes:
    a second comparator which compares a voltage of the internal node with the reference voltage and generates a second comparison signal as a comparison result; and
    a second up/down counter which generates the second impedance control code in response to the second comparison signal.

7. The semiconductor device according to claim 6, wherein the fourth control circuit includes:
    a second dithering detector which responds to the second comparison signal and detects whether a voltage of the internal node converges into the reference voltage; and
    a second register which receives and stores the second impedance control code when a voltage of the internal node is converging to the reference voltage.

8. The semiconductor device according to claim 7, wherein the output impedance control circuit further includes a clock generator for generating first and second clock signals in response to a system clock.

9. The semiconductor device according to claim 8, wherein the first up/down counter and the first dithering detector operate in synchronization with a first clock signal, and the second up/down counter and dithering detector operate in synchronization with a second clock signal.

10. The semiconductor device according to claim 3, wherein the first MOS array includes a plurality of PMOS transistors connected in parallel between the power supply voltage and the pad and are controlled by the first impedance control code.

11. The semiconductor device according to claim 5, wherein the second MOS array includes a plurality of PMOS transistors connected in parallel between the power supply voltage and the internal node and are controlled by the first impedance control code.

12. The semiconductor device according to claim 5, wherein the third MOS array includes a plurality of NMOS transistors connected in parallel between the internal node and the ground voltage and are controlled by the second impedance control code.

13. The semiconductor device according to claim 8, wherein the output impedance control circuit further includes means for controlling a feedback loop between the level controller and a gate of the second transistor in response to an output of the first dithering detector.

14. The semiconductor device according to claim 13, wherein the feedback loop is cut off before a voltage of the pad converges to the reference voltage.

15. The semiconductor device according to claim 13, wherein when the feedback loop is cut off, the first and second transistors are turned off.

16. The semiconductor device according to claim 13, wherein the feedback loop is formed when a voltage of the pad converges to the reference voltage.

17. The semiconductor device according to claim 13, wherein when the feedback loop is formed, the first and second first transistors are turned on.

18. The semiconductor device according to claim 13, wherein the means for controlling a feedback loop includes a PMOS transistor and an NMOS transistor,
wherein the PMOS transistor is connected between the power supply voltage and an output of the level controller and is controlled by an output of the first dithering detector, and the NMOS transistor is connected between the output of the level controller and a gate of the second transistor and is controlled by the output of the second dithering detector.

19. The semiconductor device according to claim 13, wherein the first and second transistors are formed of a PMOS transistor.

20. A semiconductor device comprising:
an output buffer circuit for outputting data from the semiconductor device;
a pad connected to an external resistor; and
an output impedance control circuit connected to the pad which controls an impedance of the output buffer circuit in response to an impedance of the external resistor, the output impedance control circuit including a current mirror circuit including at least one transistor connected to the pad, at least one MOS array, whose impedance is matched to an impedance of the external resistor, and a comparator for reducing a quantization error of a voltage at least two internal nodes.

21. The semiconductor device according to claim 20, further comprising:
a feedback circuit for feeding back an output of the comparator to the at least one transistor.

22. A method of controlling impedance of an output buffer circuit comprising:
controlling a gate voltage of a first transistor in response to a voltage of an external pad and a reference voltage to establish the external pad at a given voltage;
comparing the voltage of the pad with the reference voltage and generating a first comparison signal as a comparison result; and
generating a first impedance control code in response to whether the voltage of the external pad is converging to the reference voltage,
supplying current to the external pad in response to the first impedance control code; and
controlling a pull-up impedance of the output buffer circuit in response to the first impedance control code when a voltage of the external pad is converging to the reference voltage.

23. The method of controlling impedance according to claim 22, further comprising:
detecting whether a voltage of the external pad is converging to the reference voltage;
receiving and storing the first impedance control code when a voltage of the external pad is converging to the reference voltage; and
transferring the first impedance control code to the output buffer circuit.

24. A semiconductor device performing the method of controlling impedance of claim 22.

* * * * *